(12) United States Patent
Brown et al.

(10) Patent No.: US 8,239,738 B2
(45) Date of Patent: Aug. 7, 2012

(54) TRANSPARENT IN-BAND FORWARD ERROR CORRECTION FOR SIGNAL CONDITIONING-ENCODED SIGNALS

(75) Inventors: Matthew Brown, Kinburn (CA); Sean Campeau, Kanata (CA)

(73) Assignee: Applied Micro Circuits Corporation, San Diego, CA (US)

( * ) Notice: Subject to any disclaimer, the term of this patent is extended or adjusted under 35 U.S.C. 154(b) by 926 days.

(21) Appl. No.: 12/276,808

(22) Filed: Nov. 24, 2008

(65) Prior Publication Data

US 2010/0131830 A1  May 27, 2010

(51) Int. Cl.
*H03M 13/00* (2006.01)
(52) U.S. Cl. .......................... 714/776; 714/752
(58) Field of Classification Search ............ 714/752, 714/776
See application file for complete search history.

(56) References Cited

U.S. PATENT DOCUMENTS

| 6,628,725 | B1 * | 9/2003 | Adam et al. | 375/259 |
| 7,302,631 | B2 * | 11/2007 | Bansal | 714/775 |
| 2005/0047433 | A1 * | 3/2005 | Rizer et al. | 370/464 |
| 2006/0015790 | A1 * | 1/2006 | Bansal | 714/752 |

* cited by examiner

*Primary Examiner* — Philip Guyton
(74) *Attorney, Agent, or Firm* — Law Office of Gerald Maliszewski; Gerald Maliszewski

(57) ABSTRACT

A system and method are provided for framing messages in a forward error correction (FEC) structure for data streams encoded with redundant signal conditioning information. The method accepts signal conditioning-encoded words at a first bit rate, and eliminates redundant information in the signal conditioning-encoded words, creating N reduced-bit words of k bits. The k-bit words are mapped into a payload field of $N*(k/p)$ p-bit words. Overhead (OH) and FEC parity fields are generated, and a frame is created including the OH field, payload field, and FEC parity field. The bit values in the frame are then pseudorandomly scrambled and the scrambled frame is transmitted at the first bit rate. A system and method are also presented for recovering the signal conditioning-encoded words from an FEC frame.

32 Claims, 5 Drawing Sheets

Fig. 4

| 10 OH | 229 PAYLOAD BYTES (203-5/9 9-BIT WORDS) | 16 PARITY |
|---|---|---|
| 9 OH | 230 PAYLOAD BYTES (204-4/9 9-BIT WORDS) | 16 PARITY |

| | |
|---|---|
| OVERHEAD BYTES | 19 |
| PAYLOAD BYTES | 459 |
| PARITY BYTES | 32 |
| TOTAL BYTES | 510 |
| NUMBER OF 9-BIT WORDS IN PAYLOAD | 408 |
| RELATIVE LINE RATE CAPACITY | 1 |
| SPARE CAPACITY | 0.00% |

Fig. 7

START — 700

↓

RECEIVING FRAME AT FIRST DATA RATE — 702

↓

IDENTIFYING FIELDS IN FRAME — 703

↓

DESCRAMBLING — 704

↓

CORRECTING ERRORS IN PAYLOAD — 706

↓

DEMAPING PAYLOAD INTO k-BIT WORDS — 708

↓

CREATING SIGNAL CONDITIONING-ENCODED WORDS — 710

↓

SUPPLYING SIGNAL CONDITIONING-ENCODED WRODS AT FIRST DATA RATE — 712

Fig. 5

| BLOCK | BLOCK BYTE # | FRAME BYTE # | \multicolumn{8}{c}{BIT NUMBER PER BYTE} |
|---|---|---|---|---|---|---|---|---|---|---|
| | | | 0 | 1 | 2 | 3 | 4 | 5 | 6 | 7 |
| 0 | 0 | 0 | {0,0} | {0,1} | {0,2} | {0,3} | {0,4} | {0,5} | {0,6} | {0,7} |
| 0 | 1 | 1 | {0,8} | {1,0} | {1,1} | {1,2} | {1,3} | {1,4} | {1,5} | {1,6} |
| 0 | 2 | 2 | {1,7} | {1,8} | {2,0} | {2,1} | {2,2} | {2,3} | {2,4} | {2,5} |
| 0 | 3 | 3 | {2,6} | {2,7} | {2,8} | {3,0} | {3,1} | {3,2} | {3,3} | {3,4} |
| ... | ... | ... | ... | ... | ... | ... | ... | ... | ... | ... |
| 0 | 227 | 227 | {201,7} | {201,8} | {202,0} | {202,1} | {202,2} | {202,3} | {202,4} | {202,5} |
| 0 | 228 | 228 | {202,6} | {202,7} | {202,8} | {203,0} | {203,1} | {203,2} | {203,3} | {203,4} |
| 0 | 229 | 229 | {203,5} | {203,6} | {203,7} | {203,8} | {204,0} | {204,1} | {204,2} | {204,3} |
| 1 | 0 | 230 | {204,4} | {204,5} | {204,6} | {204,7} | {204,8} | {205,0} | {205,1} | {205,2} |
| 1 | 1 | 231 | {205,3} | {205,4} | {205,5} | {205,6} | {205,7} | {205,8} | {206,0} | {206,1} |
| 1 | 2 | 232 | {206,2} | {206,3} | {206,4} | {206,5} | {206,6} | {206,7} | {206,8} | {207,0} |
| ... | ... | ... | ... | ... | ... | ... | ... | ... | ... | ... |
| 1 | 225 | 455 | {404,4} | {404,5} | {404,6} | {404,7} | {404,8} | {405,0} | {405,1} | {405,2} |
| 1 | 226 | 456 | {405,3} | {405,4} | {405,5} | {405,6} | {405,7} | {405,8} | {406,0} | {406,1} |
| 1 | 227 | 457 | {406,2} | {406,3} | {406,4} | {406,5} | {406,6} | {406,7} | {406,8} | {407,0} |
| 1 | 228 | 458 | {407,1} | {407,2} | {407,3} | {407,4} | {407,5} | {407,6} | {407,7} | {407,8} |

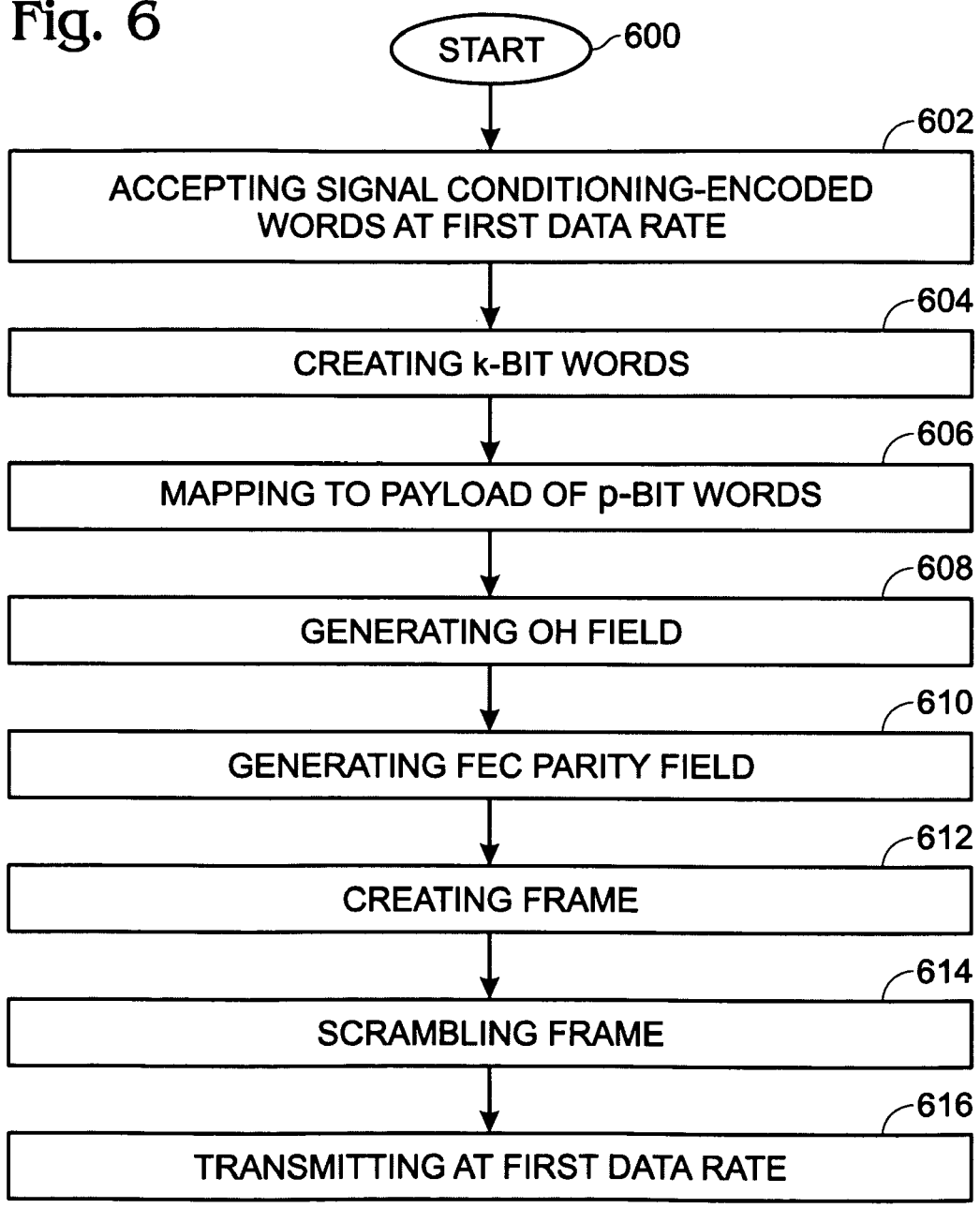

TRANSPARENT IN-BAND FORWARD ERROR CORRECTION FOR SIGNAL CONDITIONING-ENCODED SIGNALS

BACKGROUND OF THE INVENTION

1. Field of the Invention

This invention generally relates to digital communications and, more particularly, to a system and method converting signal conditioning-encoded signals into a frame structure with forward error correction.

2. Description of the Related Art

Ethernet messages, either octets of data or control information, are redundantly encoded for the purpose of maintaining DC balance, which is also referred to as running disparity (RD), and ensuring sufficient edge density. 8 B/10 B is a common RD-encoded format. 8-bit symbols are mapped into 10-bit symbols, coded to provide a sufficient number of state changes to permit clock recovery from the data stream and to ensure DC balance. 8 B/10 B coding is used applications such as PCI Express, IEEE 1394b, Fibre Channel, Gigabit Ethernet, InfiniBand, and XAUI to name but a few. Using a system that controls long-term DC-balance and edge density permits a data stream to be transmitted through a channel with a high-pass characteristic, and to be recovered with conventional clock and data recovery units.

IEEE 802.3ah is a recent standard, adding forward error correction (FEC) to 1.25 gigabit per second (Gbps) Ethernet. However, the frame structure and FEC added in this standard make for inefficient use of the available bandwidth and require a great deal of buffering. This translates to large, expensive devices, difficulty in avoiding packet drops due to finite buffer size, and large latency.

IEEE 802.3ah is inefficient for several reasons. First, the standard requires a great deal of buffering, when used with MACs that are unable to generate input frame gaps (IFG) that are proportional to the size of the packet. The standard is inherently latent due to the required buffering.

In the standard, the individual frames (and only the frames) are protected by FEC. In order to correct the frame, 16 bytes for every 255 bytes in the frame is required for parity, plus two more bytes must be added to delineate the frame plus extra overhead. The gap between frames must be large enough to accommodate the extra overhead. To do this efficiently, the MAC must "shape" the output such that the IFG after each frame is proportional to the size of the frame to accommodate the encoding.

Alternately, the absolute minimum IFG must be very large. For a standard maximum size frame (1500 bytes) the IFG must be 103 bytes or larger. Since the average frame size may be much smaller (say 150 bytes) the effective bandwidth of the link is reduced by around 40%. Alternately, pause control may be used, but due to the latency between detecting the need for pause, sending a pause to the MAC, MAC receiving the pause request, and finally reacting to the pause request, many bytes are transmitted before a response. Likewise, when dropping the pause request a similar delay occurs resulting in sending larger than necessary gap.

Regardless of the method used to ensure proper IFG, a fairly large buffer and resultant latency equal to at least one MAC frame is incurred. Since the 802.3ah FEC parity acts on the whole Ethernet frame, an entire Ethernet frame of information must be processed to generate the FEC parity that is added to the end of that frame. Thus, an entire frame must be buffered, since the FEC processing prevents cut-through scheduling.

It would be advantageous if a redundantly encoded message format, such as 8 B/10 B, could be wrapped into an error protected frame and transmitted at the same rate as the original 8 B/10 B sequence without excessive latency and buffering requirements.

SUMMARY OF THE INVENTION

The invention disclosed herein resolves the above-mentioned problems and avoids others by retaining the same line rate as the input signal, and retaining the use of the frequency dependent components in the link. The throughput rate of the data is maintained without losing any information. With respect to FEC coding, the latency is minimized to just over the length of a single FEC block (e.g., 234 bytes), rather than having to buffer one or more MAC frames (up to 1500 bytes for standard frames and up to 9600 bytes for "jumbo" frames). Further, there is no dependence upon the MAC to shape inter-frame gaps either by system means or through pause control. More explicitly, a previously line-encoded signal is reduced in size and mapped into an FEC frame that is transmitted at the same rate as the line-encoded signal.

Accordingly, a method is provided for framing messages in a forward error correction (FEC) structure for data streams encoded with redundant signal conditioning information. The method accepts signal conditioning-encoded words at a first bit rate, and eliminates redundant information in the signal conditioning-encoded words, creating N reduced-bit words of k bits. The k-bit words are mapped into a payload field of N*(k/p) p-bit words. Overhead (OH) and FEC parity fields are generated, and a frame is created including the OH field, payload field, and FEC parity field. The bit values in the frame are then pseudorandomly scrambled and the scrambled frame is transmitted at the first bit rate.

On the decoding side, a method is provided for recovering data streams encoded with redundant information for signal conditioning, from messages framed in an FEC structure. The method receives a frame of information at a first bit rate, and identifies an OH field, payload field, and FEC parity field. Bit values in the frame are pseudorandomly descrambled. Errors in the payload are corrected using the FEC parity field, and a payload field of N*(k/p) p-bit words is demapped into N k-bit words. Redundant information used for signal conditioning is added to the k-bit words, creating signal conditioning-encoded words. The signal conditioning-encoded words are supplied at the first bit rate.

Additional details of the above-described methods, and systems for framing and recovering data streams encoded with redundant information for signal conditioning, from an FEC frame structure, are provided below.

BRIEF DESCRIPTION OF THE DRAWINGS

FIG. 4 is a diagram depicting an exemplary frame structure.

FIG. 5 is a diagram depicting 9-bit to 8-bit mapping.

FIG. 6 is a flowchart illustrating a method for framing messages in an FEC structure, for data streams encoded with redundant signal conditioning information in a communications network.

FIG. 7 is a flowchart illustrating a method in a communications network for recovering data streams encoded with redundant information for signal conditioning, from messages framed in an FEC structure.

DETAILED DESCRIPTION

Figure 1:
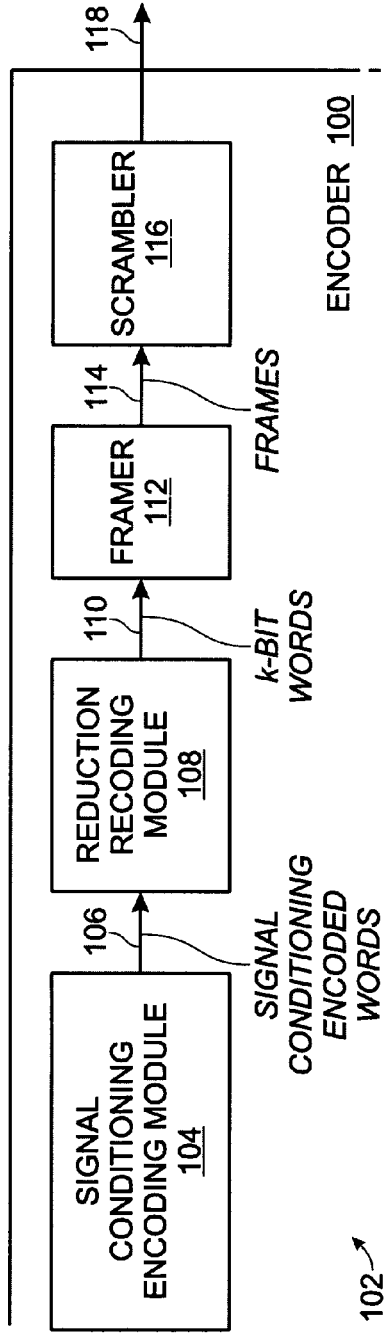
FIG. 1 is a schematic block diagram of a communications encoder with a system for framing data streams encoded with redundant information for signal conditioning into a forward error correction (FEC) frame structure.

FIG. 1 is a schematic block diagram of a communications encoder 100 with a system for framing data streams encoded with redundant information for signal conditioning into a forward error correction (FEC) frame structure. The system 102 comprises a signal conditioning encoding module 104 having an output on line 106 to supply signal conditioning-encoded words at a first bit rate. A signal conditioning-encoded word may also be referred to as a redundantly-encoded word, and it includes "extra" information besides the actual message that makes the actual message easier to recover on the receiver side. In one aspect, the signal conditioning encoding module 104 supplies signal conditioning-encoded words at a first data rate of 1.25 gigabits per second (Gbps) or 125 megabits/second (Mbps). These rates are commonly associated with Ethernet protocols. However, the system is not limited strictly to Ethernet protocols or to any particular data rates.

A reduction recoding module 108 has an input to accept the signal conditioning-encoded words. The reduction recoding module 108 eliminates redundant information used for signal conditioning, and supplies N reduced-bit words of k bits at an output on line 110. In one aspect, the reduction recoding module 108 accepts a signal conditioning-encoded word cluster having a size of 10 bits. A word cluster can be made up of 1 or 2 words. In this aspect, k=9. Typically, the 10-bit word cluster includes an 8-bit message that has either a data or control function. Then, the reduction recoding module 108 creates a 9-bit word with the 8-bit message and a 1-bit message type flag. The flag is used to indicate whether the 8-bit message has a data or control function. For example, the word cluster may be a single 8 B/10 B word, or two 4 B/5 B words. However, it should be understood that the system is applicable to other forms of encoded words that include redundant information for signal conditioning. Note: for word cluster other than 10 bits, the value of k is may be different than 9.

A framer 112 has an input on line 110 to accept the k-bit words. The framer 112 maps the k-bit words into a payload field of N*(k/p) p-bit words, and generates overhead (OH) and FEC parity fields. The FEC fields may provide parity for just the payload, or a combination of the payload and OH fields. The framer 112 supplies a frame including the OH field, payload field, and FEC parity field at an output on line 114. A scrambler 116 has an input to accept the frame. The scrambler 116 pseudorandomly scrambles the value of bits in the frame and transmits bits from the scrambled frame at the first bit rate via a network interface on line 118. The scrambling of the frame is used in place of the original use of redundant coding to manage DC balance and edge density.

In one aspect, the framer 112 maps the k-bit words into a payload field of p-bit words, where p=8, and creates a frame with 19 OH octets, 459 payload octets, and 32 parity octets. More explicitly, the framer 112 creates a frame with a first block of (I) OH octets, (229—I) payload octets, and 16 parity octets, where I is a value in a range of 0 and 18, see FIG. 4. The frame also includes a second block with (J=(18—I)) OH octets, (230—J) payload octets, and 16 parity octets. The framer includes at least one frame marker word in the OH section. This example assumes a frame structure built upon an 8-bit byte. However, it should be understood that p may equal other values besides 8, and that a byte may be some value other than 8.

Figure 2:
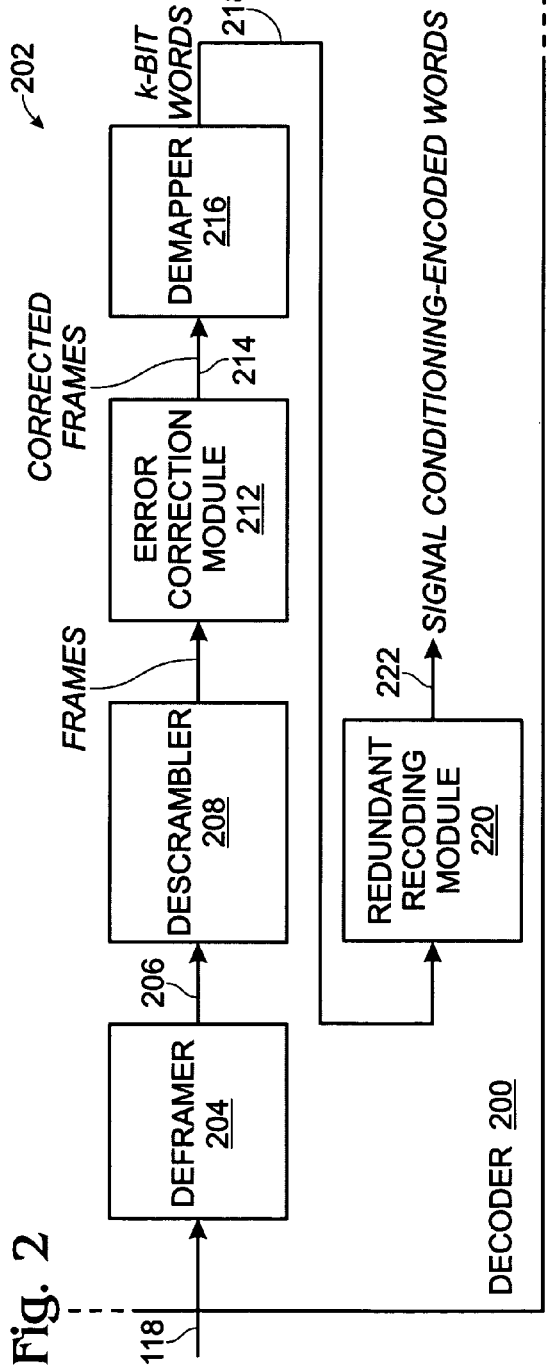
FIG. 2 is a schematic block diagram depicting a decoder with a system for recovering data streams encoded with redundant information for signal conditioning, from messages framed in an FEC structure.

FIG. 2 is a schematic block diagram depicting a decoder 200 with a system for recovering data streams encoded with redundant information for signal conditioning, from messages framed in an FEC structure. The system 202 comprises a deframer 204 having a network input on line 118 to accept a frame of information at a first bit rate. The deframer 204 identifies an OH field, payload field, and FEC parity field in the frame, and supplies the frame with identified fields at an output on line 206.

A descrambler 208 has an input on line 206 to accept the frame with identified fields. The descrambler 208 pseudorandomly descrambles bit values in the frame, and supplies the descrambled frame at an output on line 210. An error correction module 212 has an input on line 210 to accept the descrambled frame. The error correction module 212 uses the FEC parity field to correct errors in the payload field and supply a corrected payload field at an output on line 214. In some aspects, the error correction module 212 uses the FEC parity to also correct errors in the OH field. A demapper 216 has an input on line 214 to accept the corrected payload field. The demapper 216 demaps the corrected payload field of N*(k/p) p-bit words into N k-bit words, and supplies the k-bit words at an output on line 218.

In one aspect, the deframer 204 identifies a frame with 19 OH octets, 459 payload octets, and 32 parity octets. Then, the demapper 216 demaps the corrected payload field of N*(k/p) p-bit words, where p=8. More explicitly, the deframer 204 identifies a frame with a first block with (I) OH octets, (229—I) payload octets, and 16 parity octets, where I is a value in a range of 0 and 18, and a second block with (J=(18—I)) OH octets, (230—J) payload octets, and 16 parity octets. The deframer 204 identifies a least one frame marker in the OH field.

A redundant recoding module 220 has an input on line 218 to accept the k-bit words. The redundant recoding module 220 adds redundant information used for signal conditioning to the k-bit words, and supplies signal conditioning-encoded words at the first bit rate from an output on line 222. In one aspect, the redundant recoding module 220 supplies signal conditioning-encoded words at a first data rate of 1.25 Gbps or 125 Mbps.

In another aspect, the demapper 216 demaps the corrected payload field into k-bit words, where k=9, and the redundant recoding module 220 creates a signal conditioning-encoded word cluster having a size of 10 bits. The 10-bit word cluster is made up of either 1 or 2 words.

For example, the demapper 216 demaps 9-bit words with an 8-bit message, having either a data or control function, and a 1-bit message type flag. Then, the redundant recoding module 220 creates a 10-bit word cluster with the 8-bit message. For example, the redundant recoding module 220 creates 8 B/10 B or 4 B/5 B signal conditioning-encoded words.

Functional Description

The systems depicted in FIGS. 1 and 2 provide a means to transparently, with respect to control and data bytes, wrap an 8 B/10 B sequence for example, into an FEC frame, which can be transmitted at the same rate as the original 8 B/10 B sequence. Note: this same methodology applies to 4 B/5 B signals and other signals that can be transparently reduced to a lower average bit rate. The system retains the same line rate as the redundantly encoded data, so that the throughput rate is maintained without losing any information. Further, FEC coding can be added without increasing large uncontrolled amounts of latency, using large buffers or pause control, or depending upon the MAC to shape inter-frame gaps.

The encoding system first transcodes the 10-bit coded data into a 9-bit code word. This preserves the information content, but does not preserve the DC (1/0) balance or transition density. Secondly, the 9-bit code words are mapped into an 8-bit word space, and third, the new 8-bit data sequence is mapped into a multi-frame of Reed-Soloman (RS) FEC frames. Finally, the data is scrambled to guarantee DC balance and reasonable transition density. The reverse process is implemented in the receiver (decoder).

Figure 3:
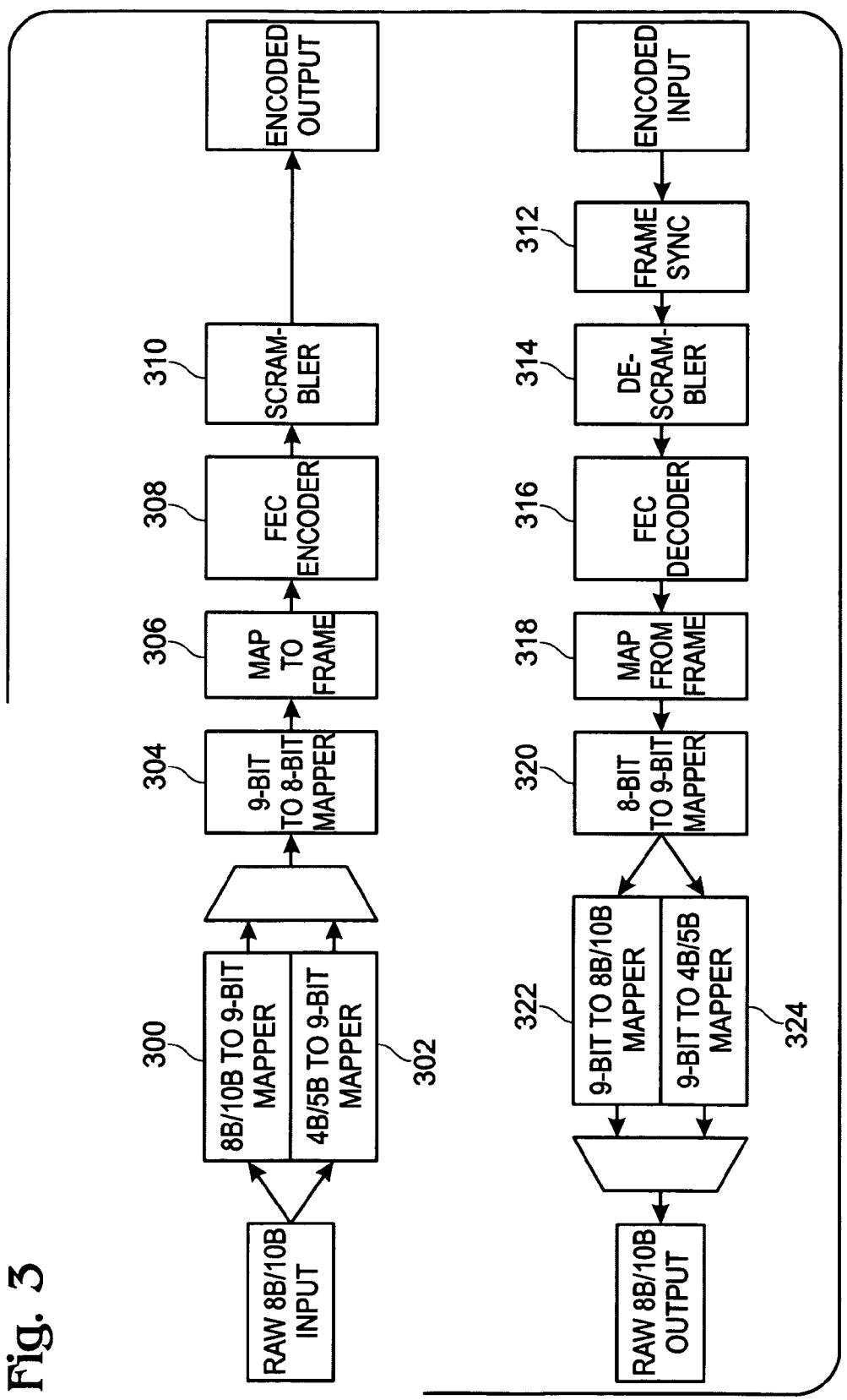
FIG. 3 is a diagram depicting egress and ingress flow processes associated with the systems of FIGS. 1 and 2.

FIG. 3 is a diagram depicting egress and ingress flow processes associated with the systems of FIGS. 1 and 2. An 8 B/10 B to 9-bit mapper 300 synchronizes to the 8 B/10 B code group and converts the 10-bit code group to a 9-bit code word with the most significant bit (MSB) indicating whether the other 8 bits are data or control. A 4 B/5 B to 9-bit mapper synchronizes to the 4 B/5 B code group and converts pairs of 5 B words to a 9-bit code word with the MSB indicating whether the other 8 bits are data or control. A 9-bit to 8-bit word mapper 304 maps the stream of 9-bit words into a stream of 8-bit words. The MSB is synchronized at the beginning of each FEC frame. The map to FEC frame block 306 maps the 8-bit stream into a 230-byte payload field (for the first block) or 229-byte payload field (for the second block) for the FEC to encode. The FEC encoder 308 creates a 16 byte parity field from each of the each of the payload field input blocks, and constructs the FEC frame. The scrambler 310 scrambles the data and parity bytes using a frame synchronous scrambler.

On the ingress side, a frame sync block 312 aligns incoming data to the FEC frame marker. The descrambler 314 reverses the scrambling process applied on the egress path. The FEC decoder 316 corrects any errors in the payload field within each FEC block. The map from frame block 318 creates an 8-bit word stream from the corrected payload field. The 8-bit to 9-bit word mapper 320 maps the stream of 8-bit words into a stream of the original 9-bit words. The 9-bit to 8 B/10 B mapper 322 maps the 9-bit word stream into 8 B/10 B code groups with correct disparity. The 9-bit to 4 B/5 B mapper 324 maps the 9-bit word stream into 4 B/5 B code groups.

FIG. 4 is a diagram depicting an exemplary frame structure. A frame is composed of 510 bytes or two 255-byte FEC blocks. The payload data is mapped into 459 bytes within the two-block frame. 230 bytes of payload are mapped into the first block and 229 bytes are mapped into the second block. 408 9-bit words are mapped into the 459 bytes in a serial fashion, wrapping one 9-bit word across the blocks as necessary.

FIG. 5 is a diagram depicting 9-bit to 8-bit mapping. The bits of each 9-bit word are designated by {a,b} where a is the 9-bit word number and b is the bit number within each 9-bit words. Bit 0 is the MSB and bit 8 is the LSB.

FIG. 6 is a flowchart illustrating a method for framing messages in an FEC structure, for data streams encoded with redundant signal conditioning information in a communications network. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 600.

Step 602 accepts signal conditioning-encoded words at a first bit rate. For example, the first data rate may be 1.25 Gbps or 125 Mbps. Step 604 eliminates redundant information in the signal conditioning-encoded words, creating N reduced-bit words of k bits. Step 606 maps the k-bit words into a payload field of N*(k/p) p-bit words. Step 608 generates an OH field. Step 610 generates an FEC parity field. 612 creates a frame including the OH field, payload field, and FEC parity field. Typically, the OH section has at least one frame marker word. Step 614 pseudorandomly scrambles the value of bits in the flame. Step 616 transmits bits from the scrambled frame at the first bit rate. Typically, at least a portion of the payload field is buffered in a tangible memory medium during the generation of FEC parity. Buffering in a tangible memory may also occur in the process of reducing signal conditioning-encoded words to k-bit words, mapping k-bit words to p-bit words, framing, and scrambling.

In one aspect, accepting signal conditioning-encoded words in Step 602 includes accepting a signal conditioning-encoded word cluster having a size of 10 bits, where the cluster includes either 1 or 2 signal conditioning-encoded words. Then, creating reduced-bit words of k bits in Step 604 includes creating a 9-bit word. The 10-bit word cluster typically includes an 8-bit message with either a data or control function. Then, Step 604 creates a 9-bit word with the 8-bit message and a 1-bit message type flag. For example, Step 602 may accept 8 B/10 B or 4 B/5 B words.

In another aspect, mapping the k-bit words into a payload field of p-bit words in Step 606 includes p being equal to 8. Then, creating the frame in Step 612 includes creating a frame with 19 OH octets, 459 payload octets, and 32 parity octets. In one example, Step 612 creates a frame with a first block with (I) OH octets, (229—I) payload octets, and 16 parity octets, where I is a value in a range of 0 and 18, and a second block with (J=(18—I)) OH octets, (230—J) payload octets, and 16 parity octets.

FIG. 7 is a flowchart illustrating a method in a communications network for recovering data streams encoded with redundant information for signal conditioning, from messages framed in an FEC structure. The method starts at Step 700. Step 702 receives a frame of information at a first bit rate. Step 703 identifies an OH field, payload field, and FEC parity field in the frame. Step 704 pseudorandomly descrambles bit values in the frame. Step 706 corrects errors in the payload using the FEC parity field. Step 708 demaps the payload field of N*(k/p) p-bit words into N k-bit words. Step 710 adds redundant information used for signal conditioning to the k-bit words, creating signal conditioning-encoded words. Step 712 supplies the signal conditioning-encoded words at the first bit rate. For example, the first bit rate may be 1.25 Gbps or 125 Mbps. Typically, at least a portion of the payload field is buffered in a tangible memory medium during the processing of FEC parity. Buffering in a tangible memory may also occur in the process of generating signal conditioning-encoded words from k-bit words, demapping p-bit words to k-bit words, deframing, and descrambling.

In one aspect, demapping the payload field into k-bit words in Step 708 includes k being equal to 9. Then, creating signal conditioning-encoded words in Step 710 includes creating a signal conditioning-encoded word cluster having a size of 10 bits, where the cluster includes either 1 or 2 signal conditioning-encoded words. Demapping the payload field into 9-bit words (Step 708) may include demapping 9-bit words with an 8-bit message having a data or control functions, and a 1-bit message type flag. Then, Step 710 creates a 10-bit word cluster with the 8-bit message. For example, Step 710 creates 8 B/10 B or 4 B/5 B words.

In another aspect, identifying the OH field, payload field, and FEC parity field in the frame in Step 703 includes identifying a frame with 19 OH octets, 459 payload octets, and 32 parity octets. Then, demapping the payload field of $N*(k/p)$ p-bit words (Step 708) includes p being equal to 8. For example, Step 703 may identify a frame with a first block with (I) OH octets, (229—I) payload octets, and 16 parity octets, where I is a value in a range of 0 and 18, and a second block with (J=(18—I)) OH octets, (230—J) payload octets, and 16 parity octets. As another example, Step 703 may identify a least one frame marker in the OH field.

System and methods have been provided for framing and recovering signal conditioning-encoded words in an FEC frame structure. The invention has been illustrated in the context of 1.25 Gbps and 125 Mbps Ethernet data rates signals, and 8 B/10 B and 4 B/5 B signal conditioning. However, the invention is not limited to merely these examples. As another example, the invention has application to Infiniband, PCI Express, and other protocols. Other variations and embodiments of the invention will occur to those skilled in the art.

We claim:

1. In a communications network, a method for framing messages in a forward error correction (FEC) structure, for data streams encoded with redundant signal conditioning information, the method comprising:
    accepting signal conditioning-encoded words at a first bit rate;
    eliminating redundant information in the signal conditioning-encoded words, creating N reduced-bit words of k bits;
    mapping the k-bit words into a payload field of $N*(k/p)$ p-bit words;
    generating an overhead (OH) field;
    generating a FEC parity field;
    creating a frame including the OH field, payload field, and FEC parity field;
    pseudorandomly scrambling the value of bits in the frame; and,
    transmitting bits from the scrambled frame at the first bit rate.

2. The method of claim 1 wherein accepting signal conditioning-encoded words at the first data rate includes accepting a signal conditioning-encoded word cluster having a size of 10 bits, where the cluster includes a number of signal conditioning-encoded words selected from a group consisting of 1 and 2 words; and,
    wherein creating reduced-bit words of k bits includes creating a 9-bit word.

3. The method of claim 2 wherein accepting the signal conditioning-encoded word cluster of 10 bits includes accepting a 10-bit word cluster with an 8-bit message of a function selected from a group consisting of data and control; and,
    wherein creating the 9-bit reduced word includes creating a 9-bit word with the 8-bit message and a 1-bit message type flag.

4. The method of claim 2 wherein accepting the signal conditioning-encoded word cluster of 10 bits includes accepting signal conditioning-encoded words selected from a group consisting of 8 B/10 B and 4 B/5 B words.

5. The method of claim 1 wherein accepting signal conditioning-encoded words at the first data rate includes accepting signal conditioning-encoded words at a first data rate selected from a group consisting of 1.25 gigabits per second (Gbps) and 125 megabits/second (Mbps).

6. The method of claim 1 wherein mapping the k-bit words into a payload field of p-bit words includes p being equal to 8; and,
    wherein creating the frame includes creating a frame with 19 OH octets, 459 payload octets, and 32 parity octets.

7. The method of claim 6 wherein creating the frame includes creating a first block with (I) OH octets, (229—I) payload octets, and 16 parity octets, where I is a value in a range of 0 and 18, and a second block with (J=(18−I)) OH octets, (230−J) payload octets, and 16 parity octets.

8. The method of claim 1 wherein creating the frame includes creating a frame with an OH section having at least one frame marker word.

9. In a communications network, a method for recovering data streams encoded with redundant information for signal conditioning, from messages framed in a forward error correction (FEC) structure, the method comprising:
    receiving a frame of information at a first bit rate;
    identifying an overhead (OH) field, payload field, and FEC parity field in the frame;
    pseudorandomly descrambling bit values in the frame;
    correcting errors in the payload using the FEC parity field;
    demapping the payload field of $N*(k/p)$ p-bit words into N k-bit words;
    adding redundant information used for signal conditioning to the k-bit words, creating signal conditioning-encoded words; and,
    supplying the signal conditioning-encoded words at the first bit rate.

10. The method of claim 9 wherein demapping the payload field into k-bit words includes k being equal to 9; and,
    wherein creating signal conditioning-encoded words includes creating a signal conditioning-encoded word cluster having a size of 10 bits, where the cluster includes a number of signal conditioning-encoded words selected from a group consisting of 1 and 2 words.

11. The method of claim 10 wherein demapping the payload field into 9-bit words includes demapping 9-bit words with an 8-bit message of a function selected from a group consisting of data and control, and a 1-bit message type flag; and,
    wherein creating the signal conditioning-encoded word cluster of 10 bits includes creating a 10-bit word cluster with the 8-bit message.

12. The method of claim 10 wherein creating signal conditioning-encoded words includes creating signal conditioning-encoded words selected from a group consisting of 8 B/10 B and 4 B/5 B words.

13. The method of claim 9 wherein supplying signal conditioning-encoded words at the first data rate includes supplying signal conditioning-encoded words at a first data rate selected from a group consisting of 1.25 gigabits per second (Gbps) and 125 megabits/second (Mbps).

14. The method of claim 9 wherein identifying the OH field, payload field, and FEC parity field in the frame includes identifying a frame with 19 OH octets, 459 payload octets, and 32 parity octets; and,
    wherein demapping the payload field of $N*(k/p)$ p-bit words includes p being equal to 8.

15. The method of claim 14 wherein identifying the OH field, payload field, and FEC parity field in the frame includes identifying a frame with a first block with (I) OH octets, (229−I) payload octets, and 16 parity octets, where I is a value in a range of 0 and 18, and a second block with (J=(18−I)) OH octets, (230−J) payload octets, and 16 parity octets.

16. The method of claim 9 wherein identifying the OH field, payload field, and FEC parity field in the frame includes identifying a least one frame marker in the OH field.

17. A communications encoder with a non-transitory computer implemented system for framing data streams encoded with redundant information for signal conditioning into a forward error correction (FEC) frame structure, the system comprising:
 a signal conditioning encoding module having an output to supply signal conditioning-encoded words at a first bit rate;
 a reduction recoding module having an input to accept the signal conditioning-encoded words, the recoding module eliminating redundant information used for signal conditioning, and supplying N reduced-bit words of k bits at an output;
 a framer having an input to accept the k-bit words, the framer mapping the k-bit words into a payload field of N*(k/p) p-bit words, generating overhead (OH) and FEC parity fields, and supplying a frame including the OH field, payload field, and FEC parity field at an output; and,
 a scrambler having an input to accept the frame, the scrambler pseudorandomly scrambling the value of bits in the frame and transmitting bits from the scrambled frame at the first bit rate via a network interface.

18. The system of claim 17 wherein the reduction recoding module accepts a signal conditioning-encoded word cluster having a size of 10 bits, where the cluster includes a number of signal conditioning-encoded words selected from a group consisting of 1 and 2 words, and creates k-bit words, where k=9.

19. The system of claim 18 wherein the reduction recoding module accepts a 10-bit word cluster with an 8-bit message of a function selected from a group consisting of data and control, and creates a 9-bit word with the 8-bit message and a 1-bit message type flag.

20. The system of claim 18 wherein the reduction recoding module accepts signal conditioning-encoded words selected from a group consisting of 8 B/10 B and 4 B/5 B words.

21. The system of claim 17 wherein the signal conditioning encoding module supplies signal conditioning-encoded words at a first data rate selected from a group consisting of 1.25 gigabits per second (Gbps) and 125 megabits/second (Mbps).

22. The system of claim 17 wherein the framer maps the k-bit words into a payload field of p-bit words, where p=8, and creates a frame with 19 OH octets, 459 payload octets, and 32 parity octets.

23. The system of claim 22 wherein the framer creates a frame with a first block of (I) OH octets, (229−I) payload octets, and 16 parity octets, where I is a value in a range of 0 and 18, and a second block with (J=(18−I)) OH octets, (230−J) payload octets, and 16 parity octets.

24. The system of claim 17 wherein the framer creates a frame with an OH section including at least one frame marker word.

25. A communications decoder with a non-transitory computer implemented system for recovering data streams encoded with redundant information for signal conditioning, from messages framed in a forward error correction (FEC) structure, the system comprising:
 a deframer having a network input to accept a frame of information at a first bit rate, the deframer identifying an overhead (OH) field, payload field, and FEC parity field in the frame, and supplying a frame with identified fields at an output;
 a descrambler having an input to accept the frame with identified fields, the descrambler pseudorandomly descrambling bit values in the frame, and supplying the descrambled frame at an output;
 an error correction module having an input to accept the descrambled frame, the error correction module using the FEC parity field to correct errors in the payload field and supply a corrected payload field at an output;
 a demapper having an input to accept the corrected payload field, the demapper demapping the corrected payload field of N*(k/p) p-bit words into N k-bit words, and supplying the k-bit words at an output; and,
 a redundant recoding module having an input to accept the k-bit words, the redundant recoding module adding redundant information used for signal conditioning to the k-bit words, and supplying signal conditioning-encoded words at the first bit rate from an output.

26. The system of claim 25 wherein the demapper demaps the corrected payload field into k-bit words, where k=9; and,
 wherein the redundant recoding module creates a signal conditioning-encoded word cluster having a size of 10 bits, where the cluster includes a number of signal conditioning-encoded words selected from a group consisting of 1 and 2 words.

27. The system of claim 26 wherein the demapper demaps 9-bit words with an 8-bit message of a function selected from a group consisting of data and control, and a 1-bit message type flag; and,
 wherein the redundant recoding module creates a 10-bit word cluster with the 8-bit message.

28. The system of claim 26 where the redundant recoding module creates signal conditioning-encoded words selected from a group consisting of 8 B/10 B and 4 B/5 B words.

29. The system of claim 25 wherein the redundant recoding module supplies signal conditioning-encoded words at a first data rate selected from a group consisting of 1.25 gigabits per second (Gbps) and 125 megabits/second (Mbps).

30. The system of claim 25 wherein the deframer identifies a frame with 19 OH octets, 459 payload octets, and 32 parity octets; and,
 wherein the demapper demaps the corrected payload field of N*(k/p) p-bit words; where p=8.

31. The system of claim 30 wherein the deframer identifies a frame with a first block with (I) OH octets, (229−I) payload octets, and 16 parity octets, where I is a value in a range of 0 and 18, and a second block with (J=(18−I)) OH octets, (230−J) payload octets, and 16 parity octets.

32. The system of claim 25 wherein the deframer identifies a least one frame marker in the OH field.

* * * * *